United States Patent
Chen

(10) Patent No.: US 7,400,158 B2
(45) Date of Patent: Jul. 15, 2008

(54) TEST FIXTURE AND METHOD FOR TESTING A SEMI-FINISHED CHIP PACKAGE

(75) Inventor: Chun-Sheng Chen, Fengshan (TW)

(73) Assignee: Horng Terng Automation Co., Ltd., Kaohsiung (TW)

( * ) Notice: Subject to any disclaimer, the term of this patent is extended or adjusted under 35 U.S.C. 154(b) by 0 days.

(21) Appl. No.: 11/625,194

(22) Filed: Jan. 19, 2007

(65) Prior Publication Data

US 2007/0170938 A1 Jul. 26, 2007

(30) Foreign Application Priority Data

Jan. 26, 2006 (TW) .............................. 95102988 A

(51) Int. Cl.
*G01R 31/02* (2006.01)
(52) U.S. Cl. .................... 324/758; 414/941; 414/939
(58) Field of Classification Search ............... None
See application file for complete search history.

(56) References Cited

U.S. PATENT DOCUMENTS

| | | | | |
|---|---|---|---|---|
| 4,763,941 A * | 8/1988 | Sniderman | ................ | 294/64.1 |
| 4,987,365 A * | 1/1991 | Shreeve et al. | ............. | 324/758 |
| 5,500,605 A * | 3/1996 | Chang | ........................ | 324/758 |
| 5,574,668 A * | 11/1996 | Beaty | ........................ | 702/150 |
| 5,708,222 A * | 1/1998 | Yonezawa et al. | ........... | 73/865.8 |
| 5,955,888 A * | 9/1999 | Frederickson et al. | ....... | 324/761 |
| 6,265,886 B1 * | 7/2001 | Hamren | ..................... | 324/755 |
| 6,292,003 B1 * | 9/2001 | Fredrickson et al. | ........ | 324/754 |
| 6,394,520 B1 * | 5/2002 | Quick et al. | ............... | 294/64.1 |
| 6,590,383 B2 * | 7/2003 | Yamashita et al. | ........ | 324/158.1 |
| 7,067,015 B2 * | 6/2006 | Xia et al. | ........................ | 134/3 |
| 2002/0186005 A1 * | 12/2002 | Yamashita et al. | ........ | 324/158.1 |
| 2005/0026555 A1 * | 2/2005 | Castor | ........................ | 451/288 |
| 2007/0030018 A1 * | 2/2007 | Thurmaier | .................. | 324/758 |

\* cited by examiner

*Primary Examiner*—Ha Nguyen
*Assistant Examiner*—Richard Isla-Rodas
(74) *Attorney, Agent, or Firm*—patenttm.us

(57) ABSTRACT

A test fixture has a base, a positioning board, multiple probes, a cushion board, multiple springs and multiple inner bolts. The base has a recess defined in the base. The positioning board is mounted in the recess. The probe is mounted on the positioning board and each probe has a top contacting end. The cushion board is mounted slidably in the recess and has a socket hole to hold a semi-finished chip package. The springs are mounted in the positioning board between the recess and the cushion board and press and bias the cushion board upward. The inner bolts are mounted slidably through the cushion and the springs and the are mounted securely in the base. The cushion board and springs reduce the impact from the semi-finished chip package to the probes so that the probes would not be damaged.

3 Claims, 8 Drawing Sheets

(a) INSTALLING ACT: INSTALLING A SEMI-FINISHED CHIP PACKAGE INTO A SOCKET HOLE IN A BASE OF A TEST FIXTURE BY SUCTION FORCE FROM A VACUUM SUCTION HEAD (b) PRESSING AND FLATTENING ACT: PRESSING AN OUTER EDGE OF THE SEMI-FINISHED CHIP PACKAGE IN THE SOCKET HOLE BY THE VACUUM SUCTION HEAD WITH A MECHANICAL FORCE, PRESSING AND FLATTENING A CENTRAL AREA OF THE SEMI-FINISHED CHIP PACKAGE BY A POSITIVE AIR PRESSURE FORCE FROM THE VACUUM SUCTION HEAD AND CONTACTING MULTIPLE PROBES IN THE SOCKET HOLE WITH THE SEMI-FINISHED CHIP (c) TESTING ACT: TESTING THE SEMI-FINISHED CHIP PACKAGE THROUGH THE PROBES CONNECTED ELECTRICALLY TO A CARRIER OF A TESTING DEVICE (d) REMOVING ACT: REMOVING THE SEMI-FINISHED CHIP PACKAGE OUT FROM THE SOCKET HOLE OF THE BASE OF THE TEST FIXTURE BY THE VACUUM SUCTION HEAD

FIG.1

TEST FIXTURE AND METHOD FOR TESTING A SEMI-FINISHED CHIP PACKAGE

BACKGROUND OF THE INVENTION

1. Field of the Invention

The present invention relates to a test fixture, and more particularly to a test fixture and a method for testing a semi-finished chip package. The test fixture keeps the semi-finished chip package from deforming during the test method so that a chip or a circuit in the semi-finished chip package would not be damaged.

2. Description of Related Art

To keep a quality and a production rate of chip packages, finished chip-packages experience a final test. Moreover, semi-finished chip packages that are not encapsulated would experience an intermediate test to determine whether chips in the semi-finished chip packages function well or not.

With reference to FIGS. 7 and 8, a test system implements the intermediate test to semi-finished chip packages (90) un-encapsulated and having an outer edge and multiple contacts. The test system has a vacuum suction head (80) and a test fixture (70).

The vacuum suction head (80) may be connected to a vacuum pump and has an annular bottom edge and a through hole. The through hole is defined through the vacuum suction head (80) and communicates with the vacuum pump so a suction force from the operating vacuum pump passes through the through hole and holds one semi-finished chip package (90) on the annular bottom edge of the vacuum suction head (80).

The test fixture (70) is aligned and cooperates with the vacuum suction head (80) to test the semi-finished chip package (90) and has a top, a recess (71) and multiple probes (72). The recess (71) is defined in the top of the test fixture (70) and has an inner bottom surface. The probes (72) are conductive, are mounted through the test fixture (70), protrude up from the inner bottom surface of the recess (71) and are connected electrically to a testing device.

When test system implements the intermediate test, the vacuum suction head (80) provides a suction force and holds one semi-finished chip package (90) with the annular bottom edge abutting the outer edge of the semi-finished chip package (90). The vacuum suction head (80) then moves the semi-finished chip package (90) into the recess (71) and the annular bottom edge presses outer edge of the semi-finished chip package (90) to with a downward mechanical force. The contacts of the semi-finished chip package (90) respectively contact the probes (72) so that the testing device may test the semi-finished chip package (90) through the probes (72).

However, the annular bottom edge of the vacuum suction head (80) pressing the outer edge of the semi-finished chip package (90), the suction force sucking a central area of the semi-finished chip package (90) causes the semi-finished chip package (90) to be deform and curve. The deformation and curve of the semi-finished chip package (90) make a circuit or a chip on the semi-finished chip package (90) be damaged. Furthermore, semi-finished chip package (90) impacts the probes (72) without any cushions so that the probes (72) breaks easily.

To overcome the shortcomings, the present invention provides a test fixture and a method for testing a semi-finished chip package to mitigate or obviate the aforementioned problems.

SUMMARY OF THE INVENTION

The main objective of the invention is to provide a test fixture and a method for testing a semi-finished chip package. The test fixture keeps the semi-finished chip package from deforming during the test method so that a chip or a circuit in the semi-finished chip package would not be damaged.

A test fixture in accordance with the present invention comprises a base, a positioning board, multiple probes, a cushion board, multiple springs and multiple inner bolts. The base has a recess defined in the base. The positioning board is mounted in the recess. The probe is mounted on the positioning board and each probe has a top contacting end. The cushion board is mounted slidably in the recess and has a socket hole to hold a semi-finished chip package. The springs are mounted in the positioning board between the recess and the cushion board and press and bias the cushion board upward. The inner bolts are mounted slidably through the cushion and the springs and the are mounted securely in the base.

Other objectives, advantages and novel features of the invention will become more apparent from the following detailed description when taken in conjunction with the accompanying drawings.

BRIEF DESCRIPTION OF THE DRAWINGS

FIG. 1 is a flow diagram of a method for testing a semi-finished chip package in accordance with the present invention;

DETAILED DESCRIPTION OF THE PREFERRED EMBODIMENT

With reference to FIGS. 1, 2, 4 and 6, a method for testing a semi-finished chip package in accordance with the present invention is used with a test system to test a semi-finished chip package (70) having a bottom and multiple contacts mounted on the bottom. The test system comprises a test fixture (1) and a vacuum suction head (8).

Figure 2:
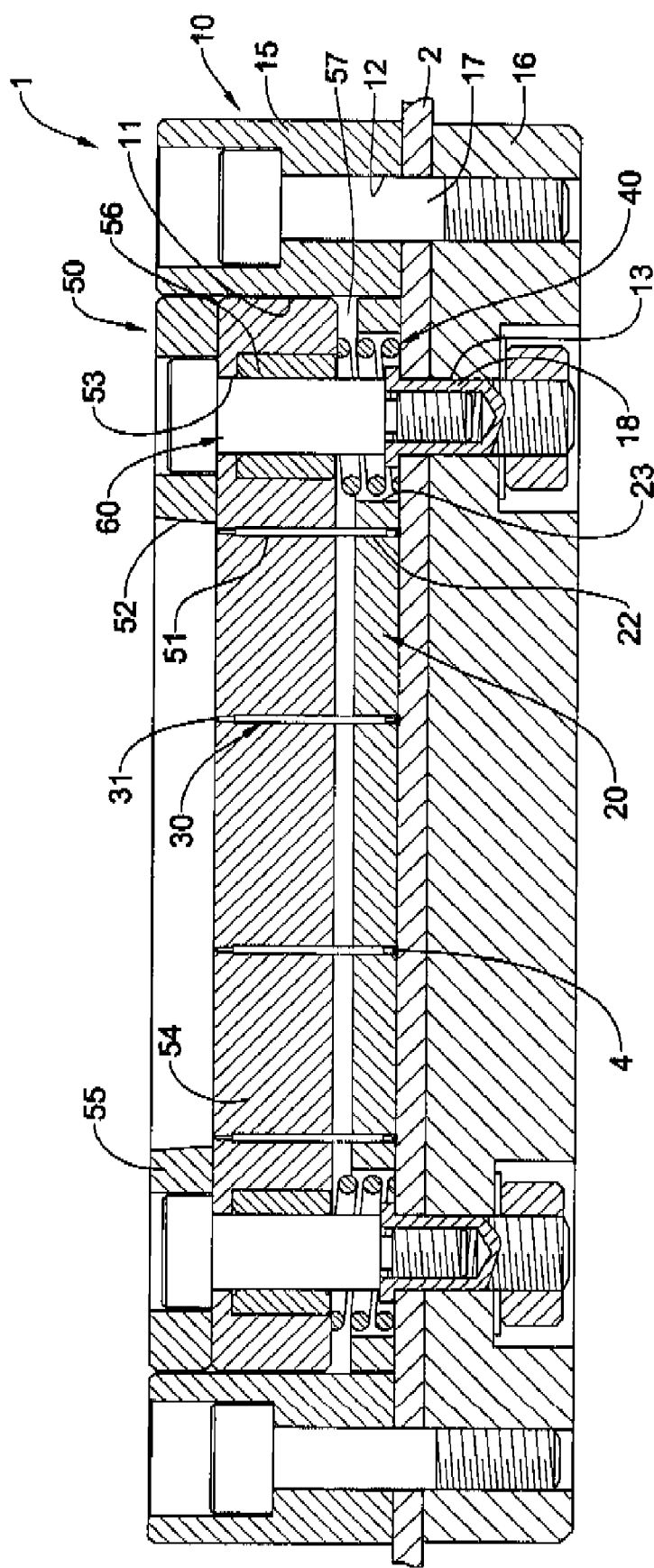
FIG. 2 is a side view in partial section of a first embodiment of a test fixture used in the semi-finished chip package in FIG. 1.
Figure 4:
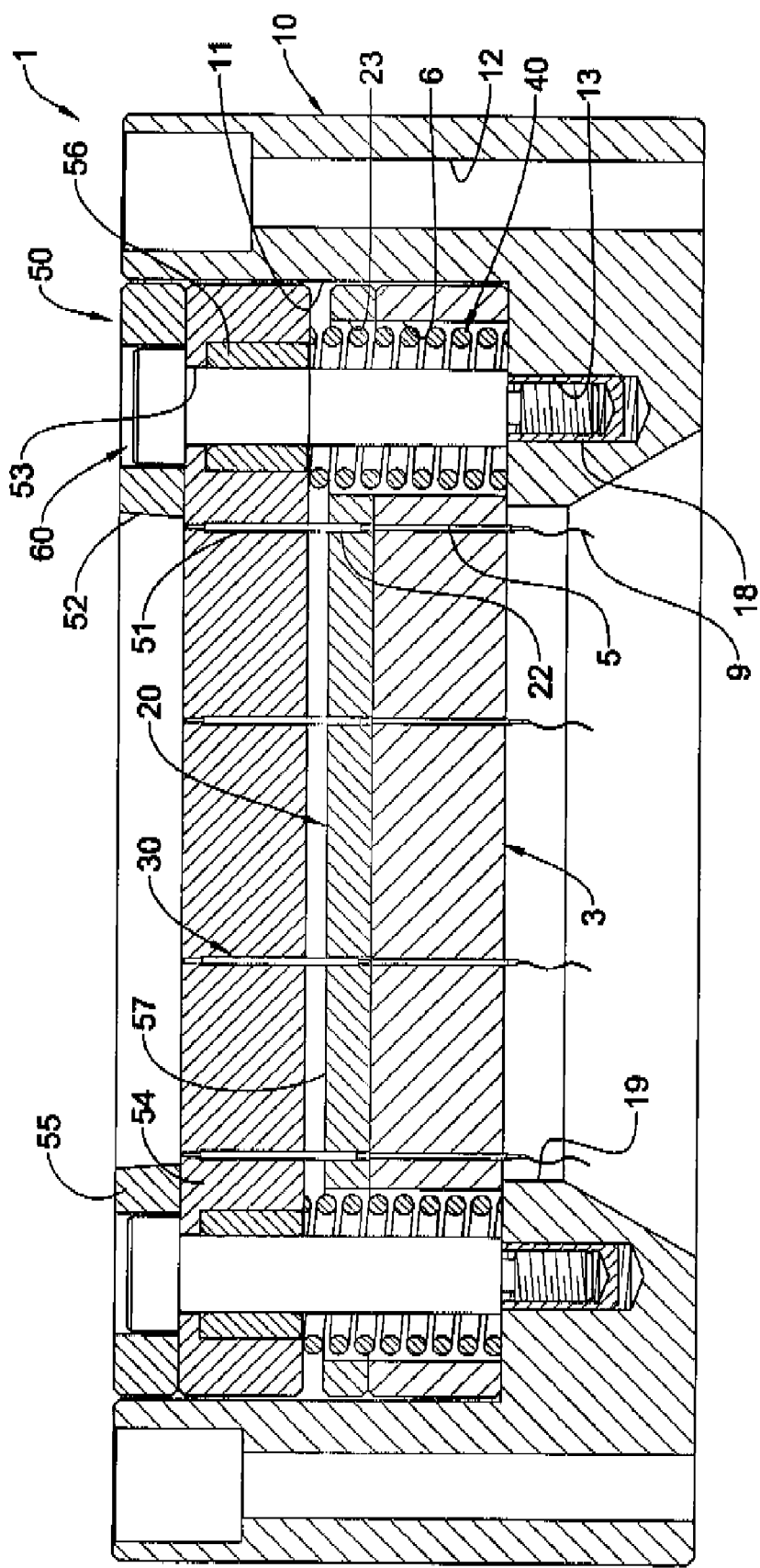
FIG. 4 is a side view in partial section of a second embodiment of a test fixture used in the semi-finished chip package in FIG. 1.

The test fixture (1) is used with a carrier of a testing device. The carrier has multiple electronic connecting elements. In a first embodiment of the test fixture (1), the carrier is a load board (2) and the electronic connecting elements are contacts (4), as shown in FIG. 2. In a second embodiment of the test fixture (1), the carrier is an electrode board (3) and the electronic connecting elements are connecting pins (5), as shown in FIG. 4. The test fixture (1) has a base (10), a positioning board (20), multiple probes (30), a cushion board (50), multiple springs (40) and multiple inner bolts (60).

The base (10) has a top, a bottom, a recess (11) and multiple inner mounting holes (13) and may have multiple outer mounting holes (12), multiple outer bolts (17) and a bottom hole (19). The recess (11) is defined in the top of the base (10) has an inner bottom surface and may hold the electrode board (3). The inner mounting holes (13) are defined in the inner bottom surface of the recess (11) and each inner mounting hole (13) has an inner thread and a bushing (18). The bushing (18) is mounted in the inner mounting hole (13). The outer mounting holes (12) are defined in the base (10) around the recess (11) and each outer mounting hole (12) has an inner thread. In the first embodiment of the test fixture, the base (10) has a top half (15) and a bottom half (16). The top and bottom halves (15, 16) cooperate to clip the load board (2) on the inner bottom surface of the recess (11). Each outer mounting hole (12) is defined through the top and bottom halves (15, 16) and has the inner thread formed in the bottom half (15). The outer bolts (17) are mounted through the load board (2) and are mounted respectively in the outer mounting holes (12) to mount the top and bottom halves (15, 16) together so that the load board (2) is mounted between the top and bottom halves (15, 16). Each outer bolt (17) has an outer thread engaging with the inner thread in one of the outer mounting holes (12). The bottom hole (19) is defined in the bottom of the base (10) and communicates with the recess (11).

Figure 3:
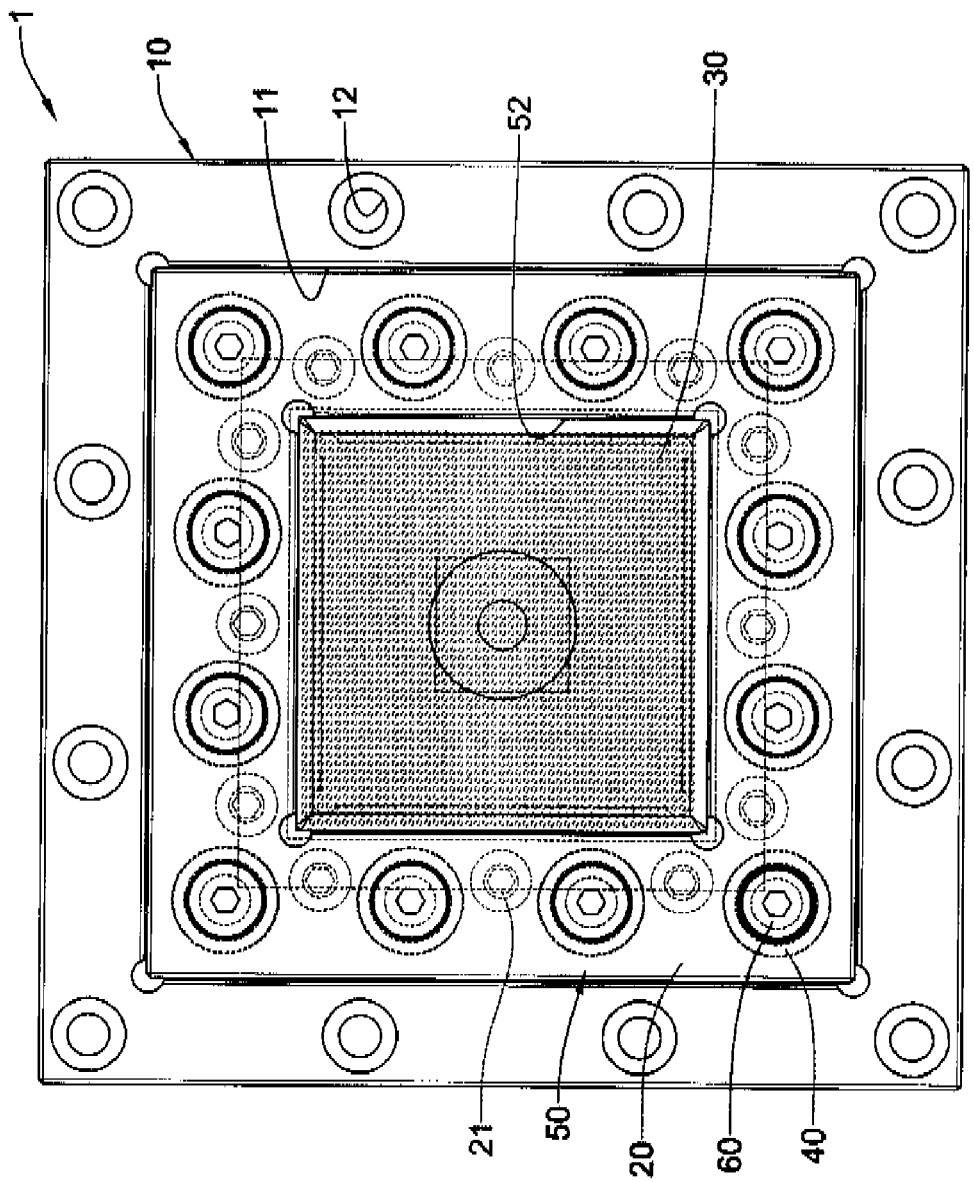
FIG. 3 is a top view of the test fixture in FIG. 2.

With further reference to FIG. 3, the positioning board (20) is mounted in the recess (11) in the base (10) above the load board (2) or the electrode board (3) and has multiple lower probe holes (22), multiple spring holes (23) and multiple mounting bolts (21). The lower probe holes (22) are defined through the positioning board (20). The spring holes (23) are defined through the positioning board (20). The mounting bolts (21) are mounted through the positioning board (20) in the inner bottom surface of the recess (11) and securely mount the positioning board (20) in the recess (11).

The probes (30) are mounted on the positioning board (20), are connected electrically to the carrier and each probe (30) has a top contacting end (31) and a bottom end. The top contacting ends (31) of the probes (30) may respectively contact the contacts on the semi-finished chip package (7). The bottom ends of the probes (30) are mounted respectively in the lower probe holes (22) in the positioning board (20) and may respectively contact the connecting pins (5) on the electrode board (3), as shown in FIG. 4. Alternately, the bottom ends of the probes (30) may respectively contact the contacts (4) on the load board (22).

The cushion board (50) is mounted slidably in the recess (11) in the base (10), is capable of sliding up and down in the recess (11) and keeps a variable space (57) between the cushion board (50) and the positioning board (20). The cushion board (50) may comprise a seat (54) and an annular frame (55), has a socket hole (52), multiple upper probe holes (51) and multiple inner mounting holes (53) and may have multiple oil-free bearings (56). The seat (54) has a top surface. The annular frame (55) is mounted on the seat (54). The socket hole (52) is defined in the cushion board (50), may be defined through the annular frame (55), holds the semi-finished chip package (7) and has an inner bottom surface that may be the top surface of the seat (54). The upper probe holes (51) are defined through the cushion board (50), may be defined through the seat (54), communicate with the socket hole (52) and are slidably mounted respectively around the probes (30) to selectively protrude the probes (30) into the socket hole (52). The inner mounting holes (53) are defined through the cushion board (50) and may be defined through the seat (54). The oil-free bearings (56) are mounted respectively in the inner mounting holes (53) in the cushion board (50).

The multiple springs (40) are mounted respectively in the spring holes (23) in the positioning board (20) between the inner bottom surface of the recess (11) in the base (10) and the seat (54) of the cushion board (50), press against and bias the cushion board (50) upward to retract the top contacting ends (31) of the probes (30) in the upper probe holes (51) in the cushion board (50). When the semi-finished chip package (7) is installed in the socket hole (52) in the cushion board (50), the springs (40) press against the cushion board (50), cushion and reduce the impact from semi-finished chip package (7) to the cushion board (50) so that the probes (30) would not be damaged the impact.

The inner bolts (60) are slidably mounted respectively through the inner mounting holes (53) in the cushion board (50), are mounted respectively through the springs (40), may be slidably mounted respectively through the oil-free bearings (56), are securely mounted respectively in the inner mounting holes (13) in the base (10) to hold the cushion board (50) in the recess (11). The inner bolts (60) may be securely mounted respectively in the bushings (18) in the inner mounting holes (13) in the base (10). Each inner bolts (60) has an outer thread engaging with the inner thread in one inner mounting hole (13) in the base (10).

Figure 5:
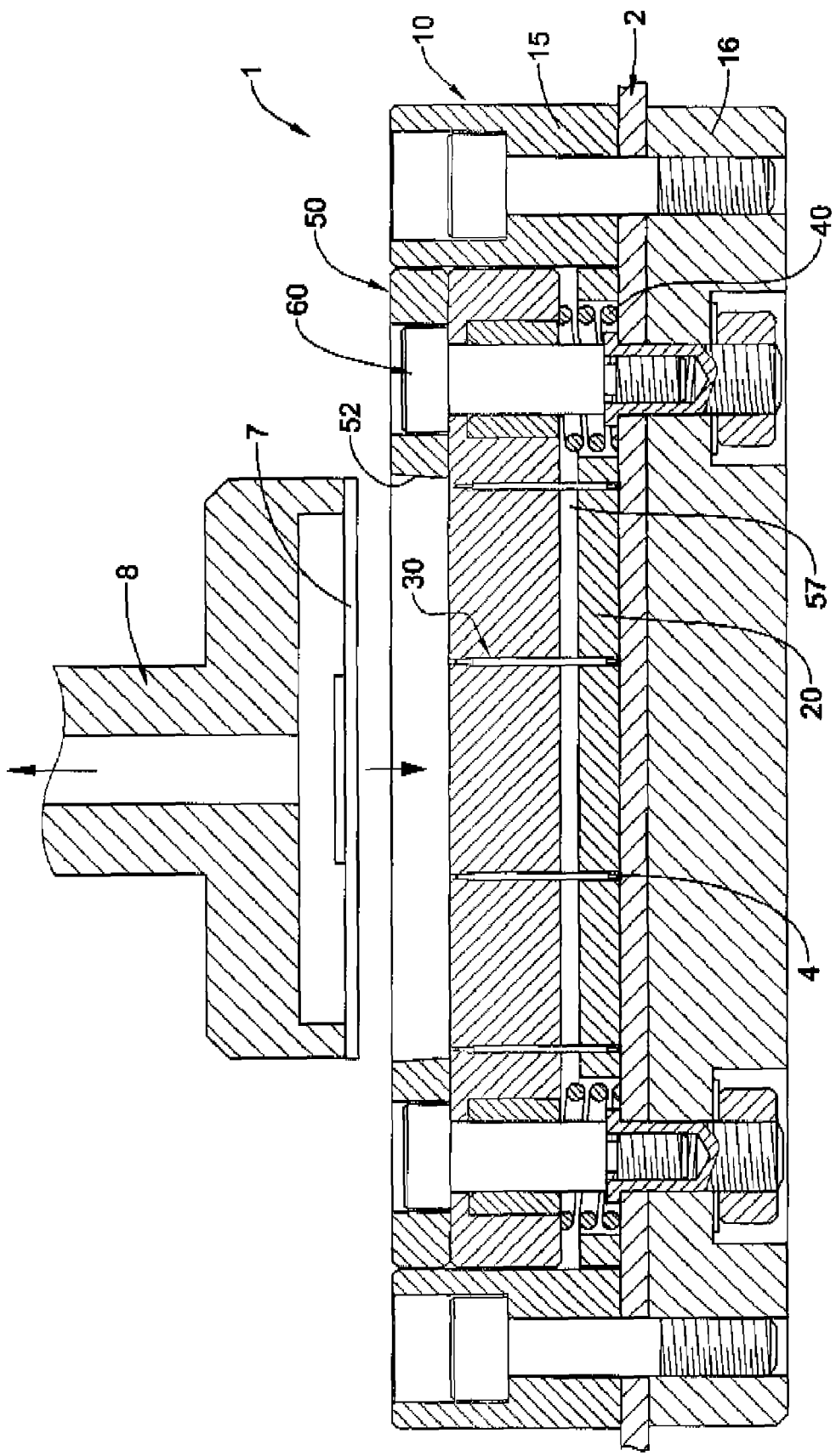
FIG. 5 is an operation side view in partial section of the test fixture in FIG. 2 with the vacuum suction head holding the semi-finished chip package, wherein the upward arrow in the through hole in the vacuum suction head illustrates the suction force by the air pump.
Figure 6:
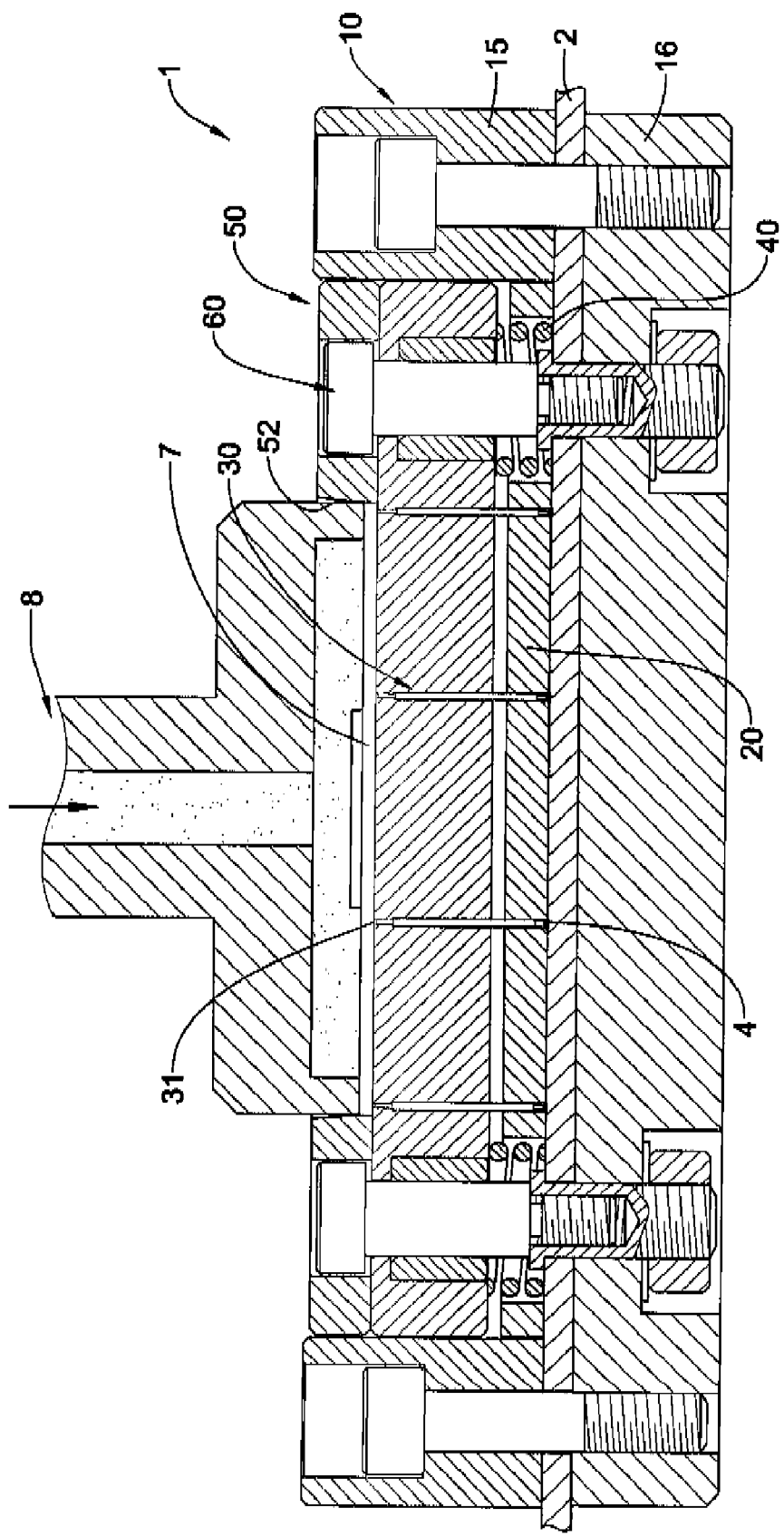
FIG. 6 is an operational side view in partial section of the test fixture in FIG. 5 with the vacuum suction head moving and pressing the semi-finished chip package in the recess of the test fixture, wherein the downward arrow in the central hole in the vacuum suction head illustrates the positive air pressure force from the vacuum suction head and the downward arrow outside the vacuum suction head illustrates the mechanical force from the vacuum suction head.
Figure 7:
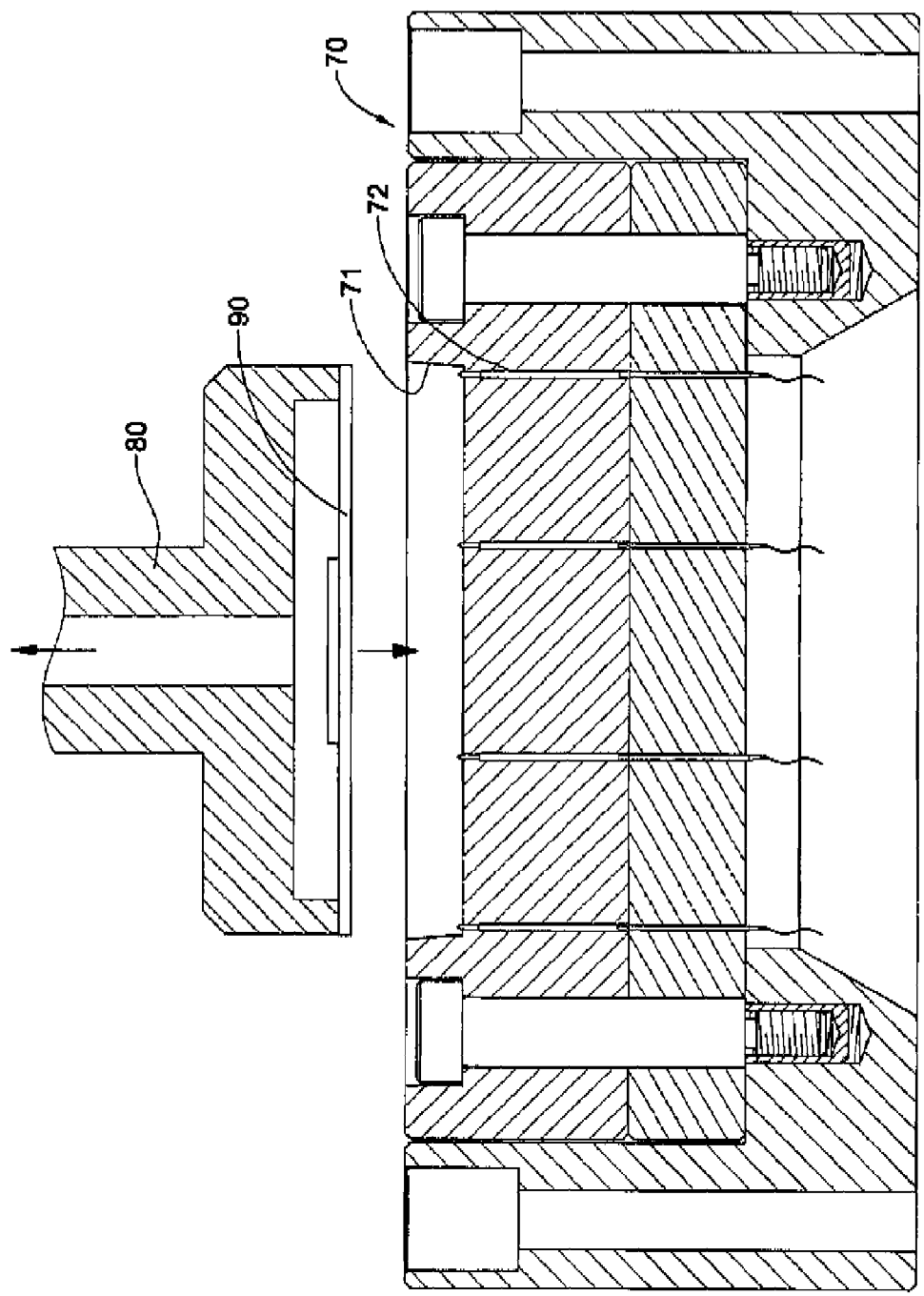
FIG. 7 is a side view in partial section of a conventional test fixture with a conventional vacuum suction head in accordance with the prior art holding a semi-finished chip package.
Figure 8:
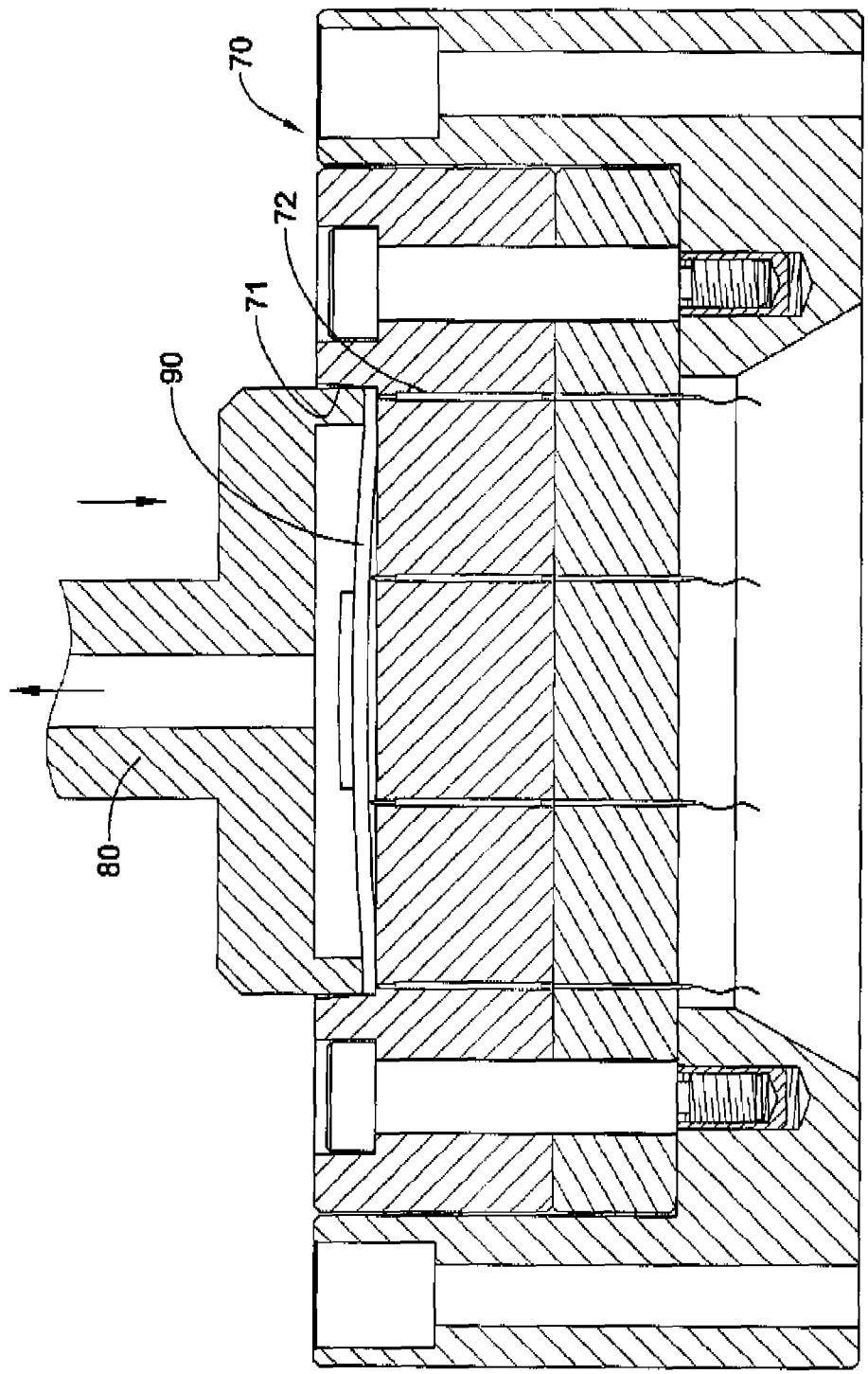
FIG. 8 is a side view in partial section of the conventional test fixture and vacuum suction head pressing the deformed and curved semi-finished chip packaged in the recess in the conventional test fixture.

With further reference to FIG. 5, the vacuum suction head (8) is connected to an air pump and is aligned with and selectively extends in the socket hole (52) in the cushion board (50) and may hold and press the semi-finished chip package (7) in the socket hole (52). The vacuum suction head (8) has an annular bottom edge and a central hole. The annular bottom edge presses an outer edge of the semi-finished chip package (7) with a mechanical force when the semi-finished chip package (7) is held in the socket hole (52). The central hole is defined through the vacuum suction head (8) and communicates with the air pump. The air pump provides a suction force through the central hole to allow the vacuum suction head (8) to suck the semi-finished chip package (7) when the vacuum suction head (8) holds and moves the semi-finished chip package (7). Alternatively, the air pump provides an positive air pressure force through the central hole to allow the vacuum suction head (8) to press and flatten a central area of the semi-finished chip package (7) when the semi-finished chip package (7) is pressed by the annular bottom edge of the vacuum suction head (8) in the socket hole (52). The positive air pressure force from the central hole is smaller than the mechanical force from the annular bottom edge. With further reference to FIG. 1, the method for testing the semi-finished chip package comprises an installing act (a), a pressing and flattening act (b), a testing act (c) and a removing act (d).

The installing act (a) is installing a semi-finished chip package (7) into a socket hole (52) in a base (10) of a test fixture (1) by a suction force from a vacuum suction head (8). The suction force here is also called negative air pressure force. The vacuum suction head (8) has an annular bottom edge abutting an outer edge of the semi-finished chip package (7) and a central hole providing the suction force that sucks and holds the semi-finished chip package (7) during installation of the semi-finished chip package (7) into the socket hole.

The pressing and flattening act (b) is pressing the outer edge of the semi-finished chip package (7) in the socket hole

(52) by the vacuum suction head (8) with a mechanical force, pressing and flattening a central area of the semi-finished chip package (7) by a positive air pressure force from the vacuum suction head (8) and contacting multiple probes (30) in the socket hole (52) with the semi-finished chip package (7). The vacuum suction head (10) presses the outer edge of the semi-finished chip package (7) with the annular bottom edge. With the pressing act (b), the semi-finished chip package (7) would not deform or curve and provides the positive air pressure force through the central hole. Therefore, the semi-finished chip package (7) uniformly contacts the probes (30). Furthermore, a chip, a circuit and the contacts on the semi-finished chip package (7) would not be damaged.

The testing act (c) is testing the semi-finished chip package (17) through the probes (30) connected electrically to a carrier of a testing device.

The removing act (d) is removing the semi-finished chip package (7) out from the socket hole (52) of the base (10) of the test fixture (1) by a suction force of the vacuum suction head (8). The vacuum suction head (8) provides the suction force to suck, hold and move the semi-finished chip package (7) out of the socket hole (52).

The cushion board (50) and springs (40) of the test fixture (1) reduce the impact from the semi-finished chip package (7) to the probes (30) during the installation of the semi-finished chip package (7) so that the probes (30) would not be damaged. Furthermore, the method with a positive air pressure force to the semi-finished chip package (7) prevents a deformation or a curve of the semi-finished chip package (7) so that the semi-finished chip package (7) would not be damaged during the intermediate test.

What is claimed is:

1. A test fixture comprising:
   a base having a top and a bottom and further having
      a recess defined in the top of the base and having an inner bottom surface; and
      multiple inner mounting holes defined in the inner bottom surface of the recess;
   a positioning board mounted in the recess and having
      multiple lower probe holes defined through the positioning board; and
      multiple spring holes defined through the positioning board;
   multiple probes mounted on the positioning board and each probe having a top contacting end and a bottom end mounted respectively in the lower probe holes in the positioning board;
   a cushion board mounted and being capable of sliding up and down in the recess and having
      a seat having a top surface and an annular frame mounted on the seat;
      a socket hole defined through the annular frame in the cushion board and having an inner bottom surface;
      multiple upper probe holes defined through the seat of the cushion board, communicating with the socket hole, slidably mounted respectively around the probes and selectively protruding the probes into the socket hole;
      multiple inner mounting holes defined through the seat of the cushion board; and
      multiple oil-free bearings mounted respectively in the inner mounting holes in the cushion board;
   multiple springs mounted respectively in the spring holes in the positioning board between the inner bottom surface of the recess and the cushion board and pressing against and biasing the cushion board upward; and
   multiple inner bolts slidably mounted respectively through the inner mounting holes in the cushion board, slidably mounted respectively through the oil-free bearings, mounted respectively through the springs and securely mounted respectively in the inner mounting holes in the base.

2. The test fixture as claimed in claim 1, wherein:
   each inner mounting hole in the base has a bushing mounted in the inner mounting hole; and
   the inner bolts are securely mounted respectively in the bushings in the inner mounting holes in the base.

3. A method for testing a semi-finished chip package comprising:
   an installing act being installing a semi-finished chip package into a socket hole in a base of a test fixture by suction force from a vacuum suction head;
   a pressing and flattening act being pressing an outer edge of the semi-finished chip package in the socket hole by the vacuum suction head with a mechanical force, pressing and flattening a central area of the semi-finished chip package by a positive air pressure force from the vacuum suction head and contacting multiple probes in the socket hole with the semi-finished chip, wherein the mechanical force is from an annular bottom edge of the vacuum suction head pressing against the outer edge of the semi-finished chip package, the positive air pressure force is from a central hole of the vacuum suction head, and the positive air pressure force from the central hole is smaller than the mechanical force from the annular bottom edge;
   a testing act being testing the semi-finished chip package through the probes connected electrically to a carrier of a testing device; and
   a removing act being removing the semi-finished chip package out from the socket hole of the base of the test fixture by the vacuum suction head.

* * * * *